United States Patent
Shibata et al.

(10) Patent No.: US 11,244,781 B2
(45) Date of Patent: Feb. 8, 2022

(54) MAGNETIZATION CONTROL ELEMENT, MAGNETIC MEMORY, AND MAGNETIC RECORDING SYSTEM

(71) Applicant: TDK CORPORATION, Tokyo (JP)

(72) Inventors: Tatsuo Shibata, Tokyo (JP); Masashi Sahashi, Tokyo (JP); Tomohiro Nozaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 188 days.

(21) Appl. No.: 16/606,271

(22) PCT Filed: Apr. 20, 2018

(86) PCT No.: PCT/JP2018/016266
§ 371 (c)(1),
(2) Date: Oct. 18, 2019

(87) PCT Pub. No.: WO2018/194155
PCT Pub. Date: Oct. 25, 2018

(65) Prior Publication Data
US 2020/0194157 A1 Jun. 18, 2020

(30) Foreign Application Priority Data
Apr. 21, 2017 (JP) .............................. JP2017-084536

(51) Int. Cl.
*H01F 10/32* (2006.01)
*G11B 5/02* (2006.01)
*H01L 43/10* (2006.01)
*H01L 27/22* (2006.01)

(52) U.S. Cl.
CPC .......... *H01F 10/3254* (2013.01); *G11B 5/02* (2013.01); *H01F 10/3272* (2013.01); *H01L 43/10* (2013.01); *H01L 27/222* (2013.01)

(58) Field of Classification Search
CPC .............................. H01F 10/3254; G11B 5/02
See application file for complete search history.

(56) References Cited

U.S. PATENT DOCUMENTS

| 7,719,883 | B2 | 5/2010 | Hochstrat et al. |
| 8,724,434 | B2 | 5/2014 | Matsuzaki et al. |
| 9,520,175 | B2 | 12/2016 | Shibata et al. |

(Continued)

OTHER PUBLICATIONS

He, Xi et al., "Robust Isothermal Electric Control of Exchange Bias at Room Temperature", Nature Materials, vol. 9, pp. 579-585, (2010).

(Continued)

*Primary Examiner* — Mark V Prenty
(74) *Attorney, Agent, or Firm* — Oliff PLC

(57) ABSTRACT

A magnetization control element according to an aspect of the invention includes a magnetization control layer containing a magnetoelectric material exhibiting a magnetoelectric effect, and a magnetic coupling layer that is magnetically coupled to a magnetization of a first surface of the magnetization control layer through exchange coupling and exhibits a magnetic state according to the magnetization of the first surface, wherein a magnetization having a component in a direction opposite to a direction of a magnetization of the magnetic coupling layer is imparted to the magnetization control layer.

20 Claims, 9 Drawing Sheets

(56) References Cited

U.S. PATENT DOCUMENTS

2020/0194157 A1* 6/2020 Shibata ............... H01F 10/3254

OTHER PUBLICATIONS

Kosub, Tobias et al., "Purely Antiferromagnetic Magnetoelectric Random Access Memory", Nature Communications, vol. 8, pp. 13985-1-13985-7, (2017).
Al-Mahdawi, Muftah et al., "Low-Energy Magnetoelectric Control of Domain States in Exchange-Coupled Heterostructures", Physical Review B, vol. 95, pp. 144423-1-144423-9, (2017).
Nozaki, Tomohiro et al., "Magnetoelectric Switching Energy In $Cr_2O_3$/Pt/Co Perpendicular Exchange Coupled Thin Film System With Small $Cr_2O_3$ Magnetization", Japanese Journal of Applied Physics, vol. 56, pp. 070302-1-070302-4, (2017).
Nozaki, Tomohiro et al., "Large Perpendicular Exchange Bias and High Blocking Temperature in Al-Doped $Cr_2O_3$/Co Thin Film Systems", Applied Physics Express, vol. 10, pp. 073003-1-073003-4, (2017).
Jul. 17, 2018 Search Report issued in International Patent Application No. PCT/JP2018/016266.

* cited by examiner

| E \ H | +z | -z |
|---|---|---|
| +z | F+ | F- |
| -z | F- | F+ |

MAGNETIZATION CONTROL ELEMENT, MAGNETIC MEMORY, AND MAGNETIC RECORDING SYSTEM

TECHNICAL FIELD

The present disclosure relates to a magnetization control element, a magnetic memory, and a magnetic recording system. Priority is claimed on Japanese Patent Application No. 2017-084536, filed Apr. 21, 2017, the content of which is incorporated herein by reference.

BACKGROUND ART

Elements using spins in magnetic materials are used in various applications. For example, a giant magnetoresistive (GMR) element including a multilayer film of ferromagnetic and nonmagnetic layers, and a tunnel magnetoresistive (TMR) element using an insulating layer (a tunnel barrier layer and a barrier layer) as a nonmagnetic layer are known. These elements are used in magnetic sensors, magnetic heads, nonvolatile random access memories (MRAMs) and the like, and are also expected to be applied to high frequency components, new magnetic recording systems and the like.

The directions of spins in many of such elements are controlled by a magnetic field. A method of controlling the directions of spins using a spin transfer torque (STT) using a spin polarization current has also been put to practical use. Methods of controlling the directions of spins using a magnetoelectric effect have also been proposed in recent years (for example, Patent Literatures 1 and 2).

CITATION LIST

Patent Literatures

[Patent Literature 1]
 U.S. Pat. No. 9,520,175
[Patent Literature 2]
 U.S. Pat. No. 8,724,434

SUMMARY OF INVENTION

Technical Problem

Magnetoelectric control elements shown in Patent Literatures 1 and 2 control the direction of magnetization in an antiferromagnet by using a magnetoelectric effect (ME effect). However, the antiferromagnet is aligned such that spins cancel their moments as a whole and thus, even if the internal magnetization state of the antiferromagnet changes, the magnetization state of the antiferromagnet cannot be externally output. When a ferromagnet magnetically coupled through exchange coupling is made adjacent to the antiferromagnet to transfer the magnetization state of a surface of the antiferromagnet to the ferromagnet, the magnetization state can be read.

However, when the magnetization in the ferromagnet is aligned in one direction, this also affects the antiferromagnet via exchange coupling. While two possible states of the antiferromagnet are equivalent when the antiferromagnet is not adjacent to the ferromagnet, two magnetization states, an easy-to-stabilize state and a hard-to-stabilize state, are formed in the antiferromagnet when the antiferromagnet is made adjacent to the ferromagnet. The magnetoelectric control element switches between the two states. That is, when the two states are formed, the amount of energy required for switching from the easy-to-stabilize state to the hard-to-stabilize state and the amount of energy required for switching from the hard-to-stabilize state to the easy-to-stabilize state are different. To perform stable data writing, it is preferable that the amounts of energy required for switching be symmetrical.

The present disclosure has been made in view of the above circumstances. It is an object to provide a magnetization control element using a magnetoelectric effect in which the difference between energy required to transition from a first state to a second state and energy required to transition from the second state to the first state is small.

Solution to Problem

The present disclosure provides the following means to solve the above problem.

(1) A magnetization control element according to a first aspect includes a magnetization control layer containing a magnetoelectric material exhibiting a magnetoelectric effect, and a magnetic coupling layer that is magnetically coupled to a magnetization of a first surface of the magnetization control layer through exchange coupling and exhibits a magnetic state according to the magnetization of the first surface, wherein a magnetization having a component in a direction opposite to a direction of a magnetization of the magnetic coupling layer is imparted to the magnetization control layer, and the magnetization control layer has, as a whole, a magnetization in the imparted magnetization direction.

(2) In the magnetization control element according to the above aspect, the magnetization control layer may include: a ferrimagnet; or an antiferromagnet in which at least one constituent element is substituted.

(3) In the magnetization control element according to the above aspect, a magnitude of magnetic energy that the magnetization imparted to the magnetization control layer generates upon writing may be smaller than a magnitude of anisotropy energy of the magnetization control layer.

(4) In the magnetization control element according to the above aspect, the exchange coupling between the magnetization control layer and the magnetic coupling layer may be antiferromagnetic coupling, and the magnetization direction imparted to the magnetization control layer may be identical to a magnetization direction of an outermost surface of the magnetization control layer on a side of the magnetic coupling layer.

(5) In the magnetization control element according to the above aspect, the magnetic coupling layer may include a first ferromagnetic layer, an intermediate layer, and a second ferromagnetic layer sequentially from a magnetization control layer side, a magnitude of a magnetization of the second ferromagnetic layer may be greater than a magnitude of a magnetization of the first ferromagnetic layer, exchange coupling between the magnetization control layer and the first ferromagnetic layer may be ferromagnetic coupling, and the magnetization direction imparted to the magnetization control layer may be the same as a magnetization direction of an outermost surface of the magnetization control layer on a magnetic coupling layer side.

(6) In the magnetization control element according to the above aspect, the exchange coupling between the magnetization control layer and the magnetic coupling layer may be ferromagnetic coupling, and the magnetization direction imparted to the magnetization control layer may be opposite to a magnetization direction of an outermost surface of the magnetization control layer on a side of the magnetic coupling layer.

(7) In the magnetization control element according to the above aspect, the magnetic coupling layer may include a first ferromagnetic layer, an intermediate layer, and a second ferromagnetic layer sequentially from a magnetization control layer side, a magnitude of a magnetization of the second ferromagnetic layer is greater than a magnitude of the first ferromagnetic layer, exchange coupling between the magnetization control layer and the first ferromagnetic layer is antiferromagnetic coupling, and the magnetization direction imparted to the magnetization control layer may be opposite to a magnetization direction of an outermost surface of the magnetization control layer on a side of the magnetic coupling layer.

(8) In the magnetization control element according to the above aspect, the magnetization control layer may contain: a material in which $Cr_2O_3$ is doped with a transition metal ion with an ion radius smaller than an ion radius of $Cr^{3+}$; or a material in which $BiFeO_3$ is doped with a transition metal ion with an ion radius smaller than an ion radius of $Fe^{3+}$.

(9) In the magnetization control element according to the above aspect, the magnetization control layer may contain: a material in which $Cr_2O_3$ is doped with a transition metal ion with an ion radius greater than an ion radius of $Cr^{3+}$; or a material in which $BiFeO_3$ is doped with a transition metal ion with an ion radius greater ion radius of $Fe^{3+}$.

(10) The magnetization control element according to the above aspect may further include a magnetic field applying part configured to apply a magnetic field to the magnetization control layer; and an electric field applying part configured to apply an electric field to the magnetization control layer.

(11) In the magnetization control element according to the above aspect, a relationship of $0.75<M_{FM}d_{FM}H_{ex}/M_{AFM}d_{AFM}H<1.25$ may hold when an external magnetic field that the magnetic field applying part applies to the magnetization control layer is H, an exchange bias magnetic field received by the magnetic coupling layer is $H_{ex}$, a thickness of the magnetic coupling layer is $d_{FM}$, a magnitude of the magnetization of the magnetic coupling layer is $M_{FM}$, a thickness of the magnetization control layer is $d_{AFM}$, and a magnitude of the magnetization of the magnetization control layer is $M_{AFM}$.

(12) A magnetic memory according to a second aspect includes the magnetization control element according to the above aspect, and a nonmagnetic layer and a magnetization fixed layer sequentially provided from a surface of the magnetic coupling layer opposite to the magnetization control layer on the surface of the magnetic coupling layer opposite to the magnetization control layer.

(13) A magnetic recording system according to a third aspect includes the magnetization control element according to the above aspect.

Advantageous Effects of Invention

According to the magnetization control element of the above aspects, it is possible to reduce the difference between the energy required to transition from the first state to the second state and the energy required to transition from the second state to the first state.

DESCRIPTION OF EMBODIMENTS

Figure 1:
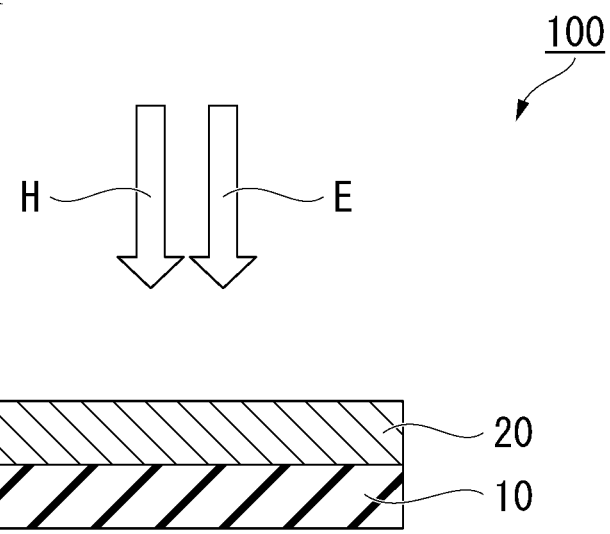
FIG. 1 is a diagram schematically showing a configuration of a magnetization control element according to a first embodiment.

Hereinafter, the configuration of the present embodiment will be described using the drawings. In the drawings used in the following description, to make features easy to understand, portions corresponding to the features are sometimes enlarged for the sake of convenience and the dimensional ratios of the components are not necessarily the same as actual ones. Also, materials, dimensions, and the like exemplified in the following description are merely examples and the present disclosure is not limited thereto.

Magnetization Control Element

First Embodiment

FIG. 1 is a diagram schematically showing the configuration of a magnetization control element according to a first embodiment. The magnetization control element 100 shown in FIG. 1 includes a magnetization control layer 10 and a magnetic coupling layer 20. The magnetization control element 100 also includes a magnetic field applying part (not shown) that applies a magnetic field H to the magnetization control layer 10 and an electric field applying part (not shown) that applies an electric field E thereto.

<Magnetization Control Layer>

The magnetization control layer 10 contains a magnetoelectric material exhibiting a magnetoelectric effect. The term "magnetoelectric effect" refers to a phenomenon in which a magnetization is induced in a material by application of an electric field thereto or a phenomenon in which electric polarization is induced in a material by application of a magnetic field thereto. Antiferromagnets, ferrimagnets, and the like are known as magnetoelectric materials exhibiting the magnetoelectric effect and specifically $\alpha$-$Cr_2O_3$, $\alpha$-$Cr_2O_{3-x}B_x$, $YMnO_3$, $BiFeO_3$ or the like in which oxygen is partially substituted by boron are known.

Figure 2A:
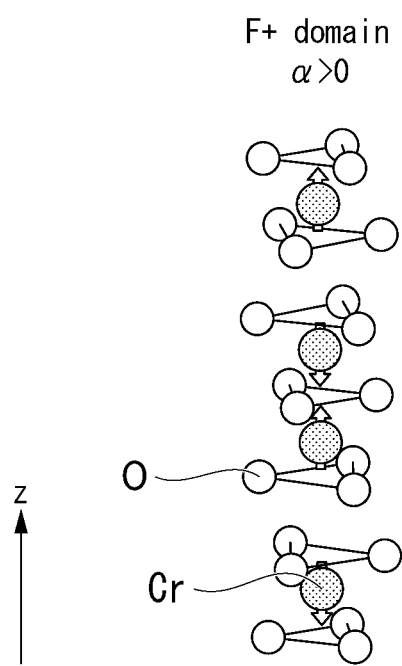
FIG. 2A is a diagram showing the crystal structure of $Cr_2O_3$ exhibiting a magnetoelectric effect and the directions of magnetizations (spins) exhibited by Cr atoms when a magnetoelectric coupling coefficient α is positive.
Figures 2B, 3:
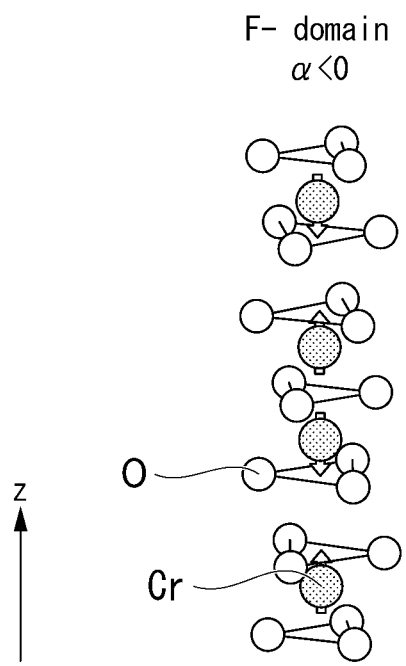
FIG. 2B is a diagram showing the crystal structure of $Cr_2O_3$ exhibiting a magnetoelectric effect and the directions of magnetizations (spins) exhibited by Cr atoms when the magnetoelectric coupling coefficient α is negative.
FIG. 3 is a diagram showing stabilized magnetization states of a magnetoelectric material according to the directions of an electric field and a magnetic field applied to the magnetoelectric material.

FIGS. 2A and 2B are diagrams showing the crystal structures of $Cr_2O_3$ exhibiting the magnetoelectric effect and the directions of magnetizations (spins) exhibited by Cr atoms. As shown in FIGS. 2A and 2B, $Cr_2O_3$ has a crystal structure in which Cr and O atoms are stacked. Hereinafter, the stacking direction is referred to as a z direction.

Since $Cr_2O_3$ is an antiferromagnet, the directions of spins of adjacent Cr atoms are opposite to each other. The spin of each Cr atom can take two states. $Cr_2O_3$ can take two magnetization states, one of which is shown in FIG. 2A and the other is shown in FIG. 2B. Hereinafter, the state shown in FIG. 2A is referred to as an F+ domain and the state shown in FIG. 2B is referred to as an F− domain.

The sign of a magnetoelectric coupling coefficient α is reversed between the F+ domain and the F− domain. The magnetoelectric coupling coefficient α is an indicator of how much a magnetization or an electric polarization develops in a magnetoelectric material when an electric field or a magnetic field is applied thereto. The magnetoelectric coupling coefficient α has a relationship of $\Delta M=\alpha E$ with the developing magnetization $\Delta M$ when the applied electric field is E and has a relationship of $\Delta P=\alpha H$ with the developing electric polarization $\Delta P$ when the applied magnetic field is H.

Whether $Cr_2O_3$ takes the F+ domain or the F− domain is controlled by the directions of the magnetic field and the electric field applied to the magnetoelectric material. For example, when an electric field is applied in the +z direction, the F+ domain develops a magnetization in the +z direction and the F− domain develops a magnetization in the −z direction.

When a magnetic field is applied in the same direction as the direction in which the magnetization develops, $Cr_2O_3$ is stabilized in one of the states. In other words, the magnetization state is stabilized in the F+ domain when the direction in which the electric field is applied and the direction in which the magnetic field is applied are the same and stabilized in the F− domain when the direction in which the electric field is applied and the direction in which the magnetic field is applied are different.

Although the case of $Cr_2O_3$ has been described as an example here, the tendency is the same in other magnetoelectric materials. FIG. 3 shows stabilized magnetization states of a magnetoelectric material according to the directions of an electric field and a magnetic field applied to the magnetoelectric material. As shown in FIG. 3, which of an F+ domain and an F− domain the magnetization state of the magnetization control layer 10 containing a magnetoelectric material can take is controlled by the directions of the applied magnetic field H and the applied electric field E. Unless specified otherwise below, magnetoelectric materials will be described based on the F+ domain.

Moreover, a magnetization is imparted to the magnetization control layer 10 according to the present embodiment. Although means for imparting a magnetization is not particularly limited, a magnetization is imparted to the magnetization control layer 10, for example, when a ferrimagnet or an antiferromagnet in which at least one of the constituent elements of the antiferromagnet is substituted is used as a material for forming the magnetization control layer 10.

A ferrimagnet is a material in which two types of magnetic ions having spins in opposite directions are present in the crystal and the magnitudes of magnetizations thereof are different from each other. Therefore, a ferrimagnet has, as a whole, a magnetization in the direction in which spins with great magnetization magnitudes are aligned. For example, $Ga_{1-x}Al_xFeO_3$ ($0 \leq x \leq 1$) can be used as a ferrimagnet.

An antiferromagnet in which at least one of the constituent elements is substituted also has a magnetization in one direction as a whole. In general, an antiferromagnet has no magnetization as a whole because magnetizations of adjacent spins cancel each other even when the F+ domain or the F− domain has been selected as the magnetization state. However, when the alignment directions of spins in the crystal are disturbed by element substitution, magnetizations of adjacent spins cannot sufficiently cancel each other and thus a magnetization develops in one direction.

The direction in which a magnetization develops in the antiferromagnet in which at least one of the constituent elements is substituted differs depending on the size of the substitution element.

When element substitution of an antiferromagnet is performed by doping the antiferromagnet with a transition metal with an ion radius smaller than an ion radius of a transition metal constituting the antiferromagnet, the direction of a magnetization imparted to the magnetization control layer 10 is the same as the direction of a magnetization developing in the magnetization control layer 10 due to the magnetoelectric effect when a positive electric field is applied in the +z direction. For example, this corresponds to the case where $Cr_2O_3$ is doped with transition metal ions ($Al^{3+}$ or $Ti^{4+}$) with an ion radius smaller than an ion radius of $Cr^{3+}$ or the case where $BiFeO_3$ is doped with transition metal ions ($Al^{3+}$ or $Co^{3+}$) with an ion radius smaller than an ion radius of $Fe^{3+}$. Here, in the case of $Cr_2O_3$, both the a-axis and the c-axis are smaller and the lattice volume is reduced, compared to when not doped.

On the other hand, when element substitution of an antiferromagnet is performed by doping the antiferromagnet with a transition metal having an ion radius greater than an ion radius of a transition metal constituting the antiferromagnet, the direction of a magnetization imparted to the magnetization control layer 10 is opposite to the direction of a magnetization developing in the magnetization control layer 10 due to the magnetoelectric effect when a positive electric field is applied in the +z direction. For example, this corresponds to the case where $Cr_2O_3$ is doped with transition metal ions ($Ir^{3+}$) with an ion radius greater than the ion radius of $Cr^{3+}$ or the case where $BiFeO_3$ is doped with transition metal ions ($Ti^{4+}$ or $Ir^{3+}$) with an ion radius greater than the ion radius of $Fe^{3+}$. Here, in the case of $Cr_2O_3$, both the a-axis and the c-axis are greater and the lattice volume increases, compared to when not doped.

The imparted magnetization has a component in the opposite direction to the direction of the magnetization of the magnetic coupling layer 20. Although details will be described later, the direction of the magnetization of the magnetic coupling layer 20 changes depending on the magnetization state of the magnetization control layer 10.

Even if the direction of the magnetization of the magnetic coupling layer 20 changes, the relationship in which the direction of imparted magnetization and the direction of the magnetization of the magnetic coupling layer 20 are opposite is maintained. The direction of the imparted magnetization changes depending on the magnetization state of the magnetic coupling layer 20.

For example, it is assumed that, when a magnetization is imparted by element substitution, the magnetization of the third Cr ion from the top among the Cr ions shown in FIG. 2A increases, such that the magnetization control layer 10 has, as a whole, a magnetization in the +z direction. In this case, if the state changes from the F+ domain shown in FIG. 2A to the F− domain shown in FIG. 2B, the alignment direction of the third Cr ion from the top becomes the −z direction. Therefore, the magnetization of the magnetization control layer 10 is in the −z direction as a whole. That is, the direction of the imparted magnetization changes depending on the magnetization state of the magnetization control layer 10.

Actually, the magnetization control layer 10 becomes have a magnetization as a whole due to a change in the alignment balance of magnetizations by element substitution, and thus the magnitudes of some magnetizations do not necessarily increase. However, when the magnetization state changes between the F+ domain and the F− domain, the directions of magnetizations of spins included in it also change. Therefore, the above example has been described as an example from which it is one of the easiest to understand how the direction of the imparted magnetization changes depending on the magnetization state of the magnetization control layer 10.

<Magnetic Coupling Layer>

Figure 4A:
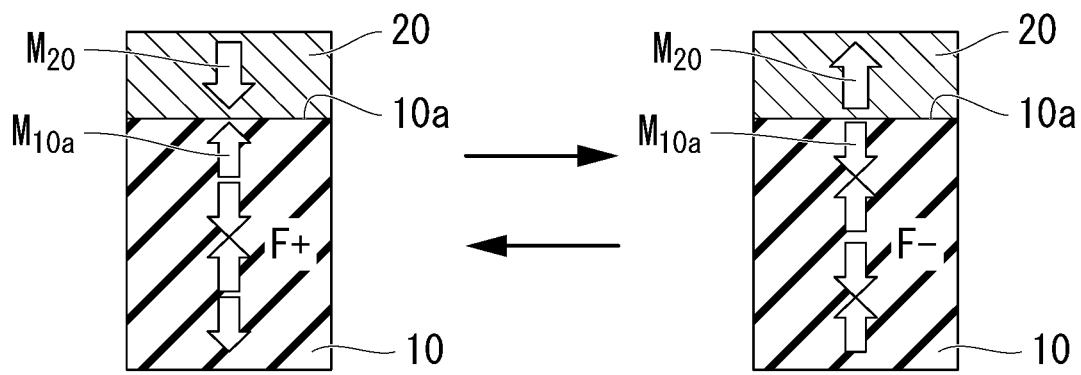
FIG. 4A is a diagram schematically showing the states of magnetizations in a magnetization control layer and a magnetic coupling layer of the magnetization control element according to the first embodiment when the exchange coupling is antiferromagnetic coupling.
Figure 4B:
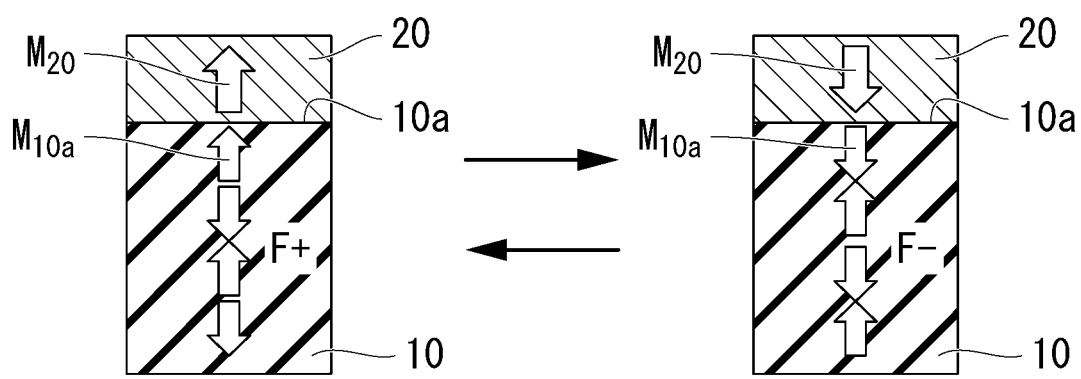
FIG. 4B is a diagram schematically showing the states of magnetizations in the magnetization control layer and the magnetic coupling layer of the magnetization control element according to the first embodiment when the exchange coupling is ferromagnetic coupling.

The magnetic coupling layer 20 is magnetically coupled to the magnetization of a first surface 10a of the magnetization control layer 10 through exchange coupling and exhibits a magnetic state according to the magnetization of the first surface 10a. FIGS. 4A and 4B are diagrams schematically showing the states of magnetizations in the magnetization control layer 10 and the magnetic coupling layer 20 of the magnetization control element 100 according to the present embodiment. The exchange coupling includes antiferromagnetic coupling shown in FIG. 4A and ferromagnetic coupling shown in FIG. 4B.

As shown in FIG. 4A, when the exchange coupling is antiferromagnetic coupling, a magnetization $M_{20}$ of the magnetic coupling layer 20 is aligned in the opposite direction to a magnetization $M_{10a}$ near the first surface 10a of the magnetization control layer 10. On the other hand, as shown in FIG. 4B, when the exchange coupling is ferromagnetic coupling, a magnetization $M_{20}$ of the magnetic coupling layer 20 is aligned in the same direction as a magnetization $M_{10a}$ near the first surface 10a of the magnetization control layer 10. That is, the magnetization state of the first surface 10a of the magnetization control layer 10 is reflected in the magnetic coupling layer 20 in the case of the antiferromagnetic coupling, and is transferred to the magnetic coupling layer 20 in the case of the ferromagnetic coupling.

As shown in FIGS. 4A and 4B, when it has been determined whether the exchange coupling between the magnetization control layer 10 and the magnetic coupling layer 20 is antiferromagnetic coupling or ferromagnetic coupling, whether the magnetization state of the magnetization control layer 10 is the F+ domain or the F− domain can be read from the alignment direction of the magnetization $M_{20}$ of the layer 20. That is, the state of the magnetization control layer 10 in which magnetizations cancel each other can be read by making the magnetic coupling layer 20 adjacent to the magnetization control layer 10.

Whether the exchange coupling is antiferromagnetic coupling or ferromagnetic coupling changes depending on a material constituting the magnetization control layer 10. When the magnetization control layer 10 is made of an oxide, it is easy to take antiferromagnetic coupling.

A known ferromagnet can be used for the magnetic coupling layer 20. For example, a metal selected from the group consisting of Cr, Mn, Co, Fe and Ni, and an alloy containing one or more of these metals and exhibiting ferromagnetism can be used. An alloy containing these metals and at least one element of B, C, and N can also be used. Specific examples are Co—Fe and Co—Fe—B.

The magnetic coupling layer 20 is not limited to one layer and may be a laminate of a plurality of layers. For example, the magnetic coupling layer 20 may have a synthetic structure including a first ferromagnetic layer, an intermediate layer, and a second ferromagnetic layer sequentially from the magnetization control layer 10 side. By adjusting the magnitudes of magnetizations of the first ferromagnetic layer and the second ferromagnetic layer in the synthetic structure, it is possible to freely control the direction of the magnetization of the overall magnetic coupling layer 20.

It is preferable that the magnitude of the magnetization imparted to the magnetization control layer 10 be sufficiently small such that reversal of the magnetization control layer 10 is not caused by application of an external magnetic field alone thereto. Specifically, it is preferable that the magnitude of the magnetization imparted to the magnetization control layer 10 be smaller than a magnitude of anisotropy energy of magnetizations included in the magnetization control layer 10 such that the direction of the magnetizations of the magnetization control layer 10 is not rewritten by magnetic energy that the magnetization imparted to the magnetization control layer 10 generates upon writing.

If the magnitude of the magnetization imparted to the magnetization control layer 10 is too great, the imparted magnetization is reversed under the influence of the external magnetic field and the direction of each magnetization in the magnetization control layer 10 is reversed due to the magnetization reversal of the imparted magnetization, thereby sometimes rewriting the F+ domain and the F− domain. Therefore, the magnetization state of the magnetization control layer 10 which is to be controlled by an electric field E and magnetic field H is rewritten by magnetic field H alone, and thus the magnetization state of the magnetization control layer 10 cannot be stably controlled.

Basically, the magnetization state of the magnetization control layer 10 is controlled by applying an electric field E and a magnetic field H thereto. Here, if the magnitude of the magnetization imparted to the magnetization control layer 10 is great enough to cause reversal with a magnetic field alone (if the magnitude of the magnetization multiplied by the magnetic field H is greater than the magnitude of anisotropy energy of the magnetization control layer 10), the magnetization control layer 10 is aligned in the direction of the magnetic field H regardless of the relationship between the electric field E and the magnetic field H, and thus stable data writing cannot be performed.

<Magnetic Field Applying Part>

The magnetic field applying part applies a magnetic field H to the magnetization control layer 10 to control the magnetization state of the magnetization control layer 10. The magnetic field applying part is not particularly limited as long as it can apply a magnetic field H to the magnetization control layer 10. For example, a permanent magnet, an electromagnet or the like can be used as the magnetic field applying part.

<Electric Field Applying Part>

The electric field applying part applies an electric field E to the magnetization control layer 10 to control the magnetization state of the magnetization control layer 10. The electric field applying part is not particularly limited as long as it can apply an electric field E to the magnetization control layer 10. For example, electrodes may be disposed such that the magnetization control layer 10 is sandwiched between them and an electric field may be applied to the magnetization control layer 10 by applying a potential between the electrodes. The electrodes may be in contact with or separated from the magnetization control layer 10 and the magnetic coupling layer 20. The magnetic coupling layer 20 may also be used as one of the electrodes since the magnetic coupling layer 20 has conductivity.

<Operation of Magnetization Control Element>

The configuration of the magnetization control element 100 has been described above. Hereinafter, the operation of the magnetization control element 100 will be described based on FIG. 5.

Figure 5:
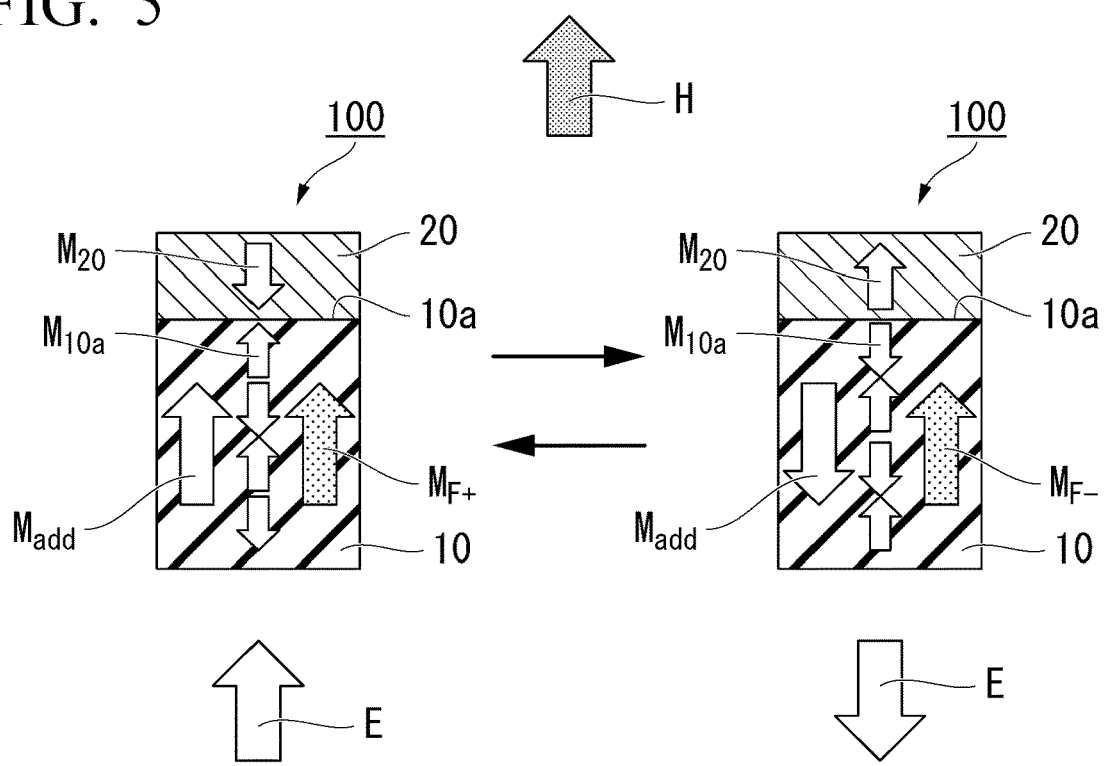
FIG. 5 is a diagram schematically showing the operation of the magnetization control element according to the first embodiment.

A magnetic field H is applied fixedly in the +z direction to the magnetization control element 100 shown in FIG. 5, and changing the direction of the electric field E changes the stable state of the magnetization of the magnetization control layer 10 between the F+ domain and the F− domain. Here, the electric field E may be fixed while the magnetic field H is changed although the case where the magnetic field H is fixed is shown.

When the magnetization state of the magnetization control layer 10 is the F+ domain, application of an electric field E in the +z direction develops a magnetization $M_{F+}$ aligned in the +z direction due to the magnetoelectric effect. On the other hand, when the magnetization state of the magnetization control layer 10 is the F− domain, application of the electric field E in the −z direction develops a magnetization $M_{F+}$ aligned in the +z direction due to the magnetoelectric effect.

A magnetization $M_{add}$ which is identical in direction to the magnetization $M_{F+}$ developed in the magnetization control layer 10 is imparted to the magnetization control layer 10. For example, this corresponds to the case where $Cr_2O_3$ is doped with $Al^{3+}$ or $Ti^{4+}$.

In the magnetization control element 100 shown in FIG. 5, the exchange coupling between the magnetization control layer 10 and the magnetic coupling layer 20 is antiferromagnetic coupling. The magnetization $M_{20}$ of the magnetic coupling layer 20 is aligned in the opposite direction to the alignment direction of the magnetization $M_{10a}$ of the first surface 10a of the magnetization control layer 10. That is, the magnetization $M_{add}$ imparted to the magnetization control layer 10 and the magnetization $M_{20}$ of the magnetic coupling layer 20 are aligned in opposite directions.

A magnetic energy (Zemann energy) generated by the magnetization $M_{add}$ imparted to the magnetization control layer 10 cancels the exchange coupling energy provided from the magnetization $M_{20}$ of the magnetic coupling layer 20 through the interface. Cancellation of the exchange coupling energy provided from the magnetization $M_{20}$ of the magnetic coupling layer 20 can reduce the difference between the energy required to transition from the F+ domain to the F− domain and the energy required to transition from the F− domain to the F+ domain.

Figure 6:
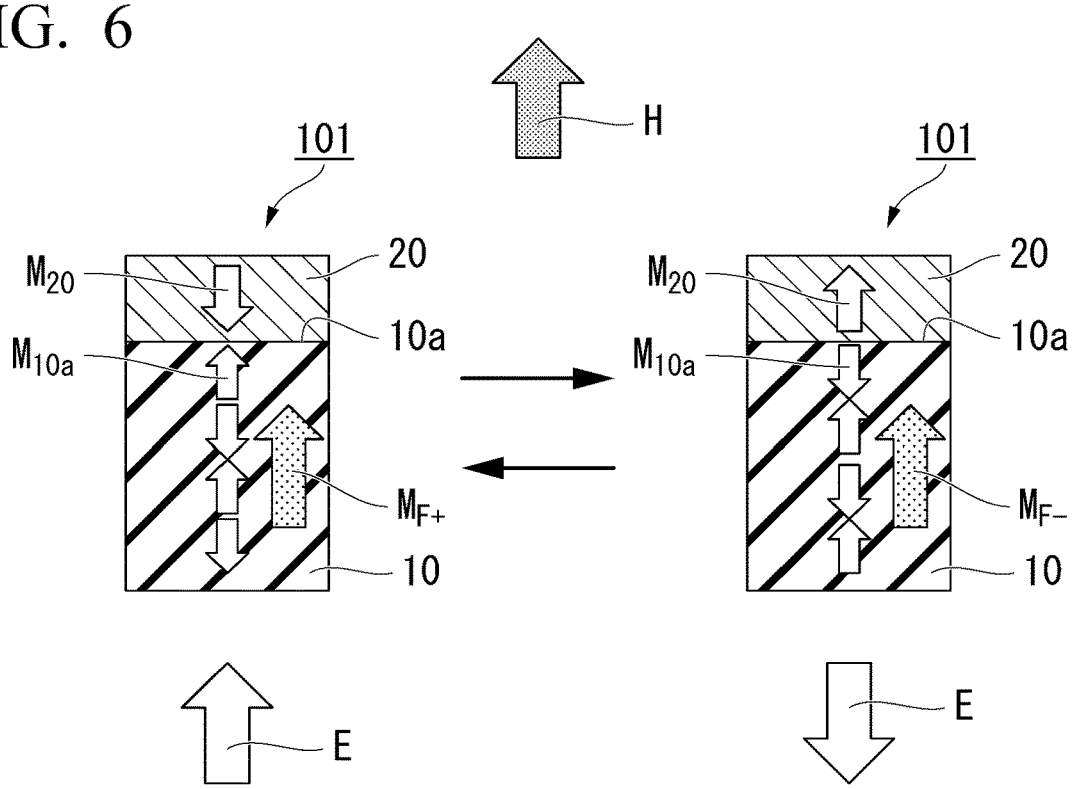
FIG. 6 is a diagram schematically showing the operation of the magnetization control element when no magnetization is imparted to the magnetization control layer.

FIG. 6 is a diagram schematically showing the operation of a magnetization control element 101 when no magnetization is imparted to the magnetization control layer 10. In the magnetization control element 101 shown in FIG. 6, the exchange coupling energy provided from the magnetization $M_{20}$ of the magnetic coupling layer 20 acts as it is since no magnetization is imparted to the magnetization control layer 10. When the magnetization $M_{20}$ is aligned in the −z direction, energy that makes the F+ domain more stable is provided to the magnetization control layer 10, and when the magnetization $M_{20}$ is aligned in the +z direction, energy that makes the F− domain more stable is provided to the magnetization control layer 10.

An external magnetic field H is also applied to the magnetization control layer 10 when the magnetization state is changed. Here, it is assumed that the magnetization of the magnetic coupling layer 20 is oriented in the direction of the external magnetic field H. That is, the magnetization control layer 10 receives energy that makes the F− domain more stable from the magnetic coupling layer 20 through exchange coupling. Therefore, when the external electric field E is applied antiparallel to the external magnetic field H to form an F− domain, it is possible to form the F− domain more easily than in the case without the magnetic coupling layer 20. On the other hand, when forming an F+ domain in the magnetization control layer 10, it is necessary to form the F+ domain against the energy applied thereto from the magnetic coupling layer 20, thus requiring a greater amount of energy. Therefore, in the case of FIG. 6, a magnetization state of the magnetization control layer 10 which is the F− domain shown on the right in the drawing is more easily formed.

Figure 7:
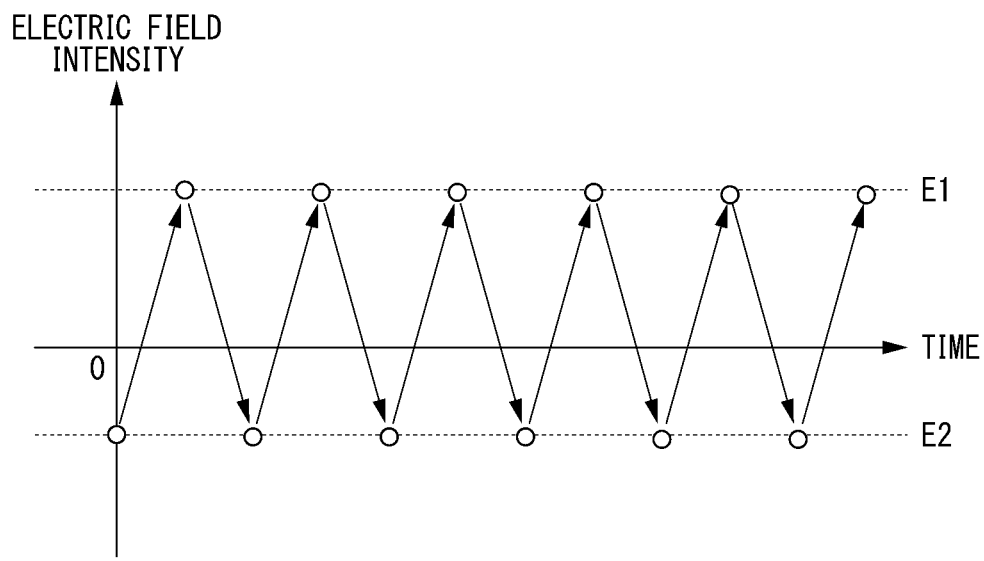
FIG. 7 is a diagram schematically showing an electric field intensity required to reverse the magnetization of the magnetization control element when no magnetization is imparted to the magnetization control layer.

FIG. 7 is a diagram schematically showing an electric field intensity required to reverse the magnetization of the magnetization control element 101 when no magnetization is imparted to the magnetization control layer 10. Since the magnetization state of the magnetization control layer 10 is more stable in the F− domain as described above, the absolute of energy E1 required to transition from the F− domain to the F+ domain is greater than the absolute of energy E2 required to transition from the F+ domain to the F− domain. That is, the amounts of energy required for switching in both directions are asymmetric and stable switching (data writing) cannot be performed.

On the other hand, when the exchange coupling energy provided from the magnetization $M_{20}$ of the magnetic coupling layer 20 is canceled by magnetic energy (Zemann energy) from the magnetization $M_{add}$ imparted to the magnetization control layer 10 as shown in FIG. 5, it is possible to remove the influence of the magnetization $M_{20}$ of the magnetic coupling layer 20 upon the magnetization control layer 10. Therefore, stabilization of the magnetization control layer 10 in one of the magnetization states is prevented, and thus the difference between the energy required to transition from the F+ domain to the F− domain and the energy required to transition from the F− domain to the F+ domain can be removed.

When equalizing the amounts of energy required for switching in both directions, it is preferable that the relationship of the following general formula (1) hold when the external magnetic field that the magnetic field applying part applies to the magnetization control layer 10 is H, an exchange bias magnetic field received by the magnetic coupling layer 20 is $H_{ex}$, the thickness of the magnetic coupling layer 20 is $d_{FM}$, the magnitude of the magnetization of the magnetic coupling layer 20 is MUM, the thickness of the magnetization control layer 10 is $d_{AFM}$, and the magnitude of the magnetization of the magnetization control layer 10 is $M_{AFM}$.

$$0.75 < M_{FM}d_{FM}H_{ex}/M_{AFM}d_{AFM}H < 1.25 \quad (1)$$

The energy applied to the magnetization control layer 10 through exchange coupling is denoted by $M_{FM}d_{FM}H_{ex}/d_{AFM}$, and the Zeeman energy by the imparted magnetization $M_{add}$ is denoted by $M_{AFM}H$. When these values completely match, the magnetic field generated by the magnetization $M_{20}$ of the magnetic coupling layer 20 is completely canceled by the magnetization $M_{add}$ imparted to the magnetization control layer 10. Therefore, within the range in which the relationship of the general formula (1) holds, it is possible that the amounts of energy required for switching in both directions can be made symmetrical adequately.

As described above, the magnetization control element 100 according to the first embodiment can reduce the influence of the magnetic field generated by the magnetization $M_{20}$ of the magnetic coupling layer 20 upon the magnetization control layer 10 by giving the magnetization $M_{add}$ aligned in a predetermined direction to the magnetization control layer 10. As a result, it is possible to reduce the difference between the energy required to transition from the F+ domain to the F− domain and the energy required to transition from the F− domain to the F+ domain. That is, the amounts of energy required to switch the magnetization control element 100 in both directions are made symmetrical and the switching operation of the magnetization control element 100 is stabilized.

Second Embodiment

Figure 8:
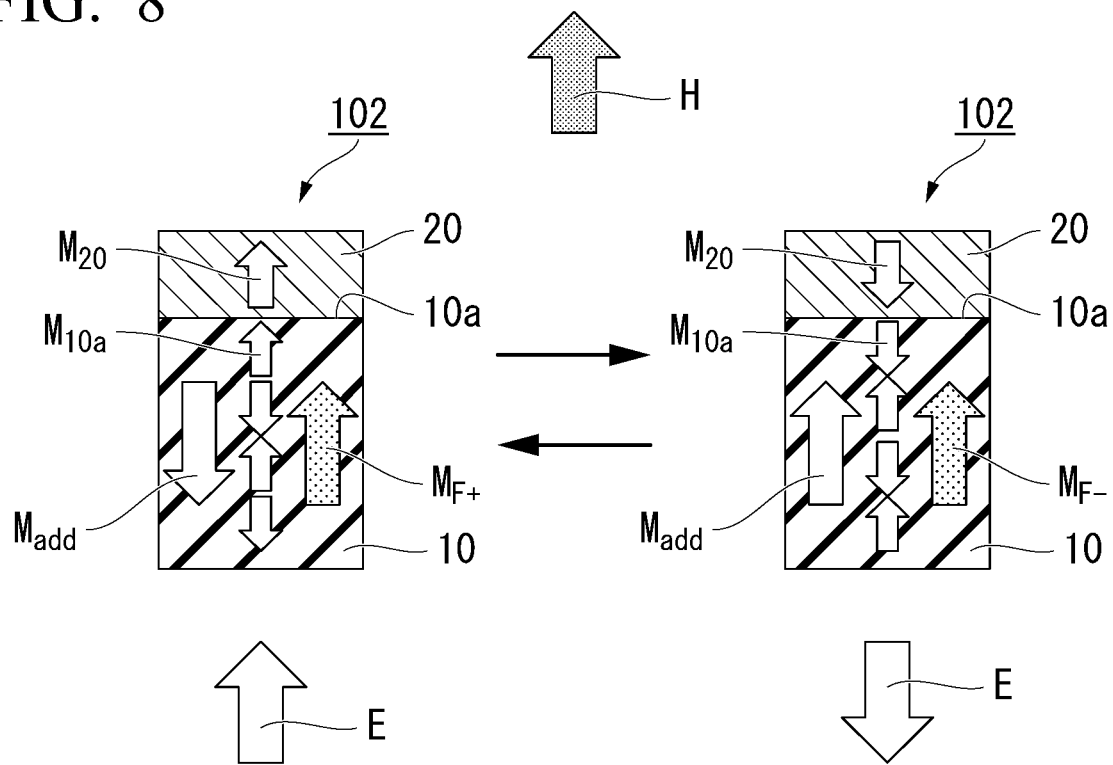
FIG. 8 is a diagram schematically showing the operation of a magnetization control element according to a second embodiment.

FIG. 8 is a diagram schematically showing the operation of a magnetization control element 102 according to a second embodiment.

The magnetization control element 102 according to the second embodiment differs from the magnetization control element 100 according to the first embodiment in that the exchange coupling between a magnetization control layer 10 and a magnetic coupling layer 20 is ferromagnetic coupling and the direction of a magnetization $M_{add}$ imparted to the magnetization control layer 10 is opposite to the magnetization direction of a first surface (outermost surface) 10a of the control layer 10 on a side of the magnetic coupling layer 20. The other conditions are identical to the magnetization control element 100 and the same reference signs are given to the same components.

The direction of the magnetization $M_{add}$ imparted to the magnetization control layer 10 in the magnetization control element 102 according to the second embodiment is opposite to a magnetization direction $M_{F+}$ that develops in the magnetization control layer 10 due to the magnetoelectric effect when an electric field E is applied in the +z direction. For example, this corresponds to the case where $Cr_2O_3$ is doped with $Ir^{3+}$.

Further, as shown in FIG. 8, in the magnetization control element 102, the exchange coupling between the magnetization control layer 10 and the magnetic coupling layer 20 is ferromagnetic coupling. Therefore, the magnetization $M_{20}$ of the magnetic coupling layer 20 is aligned in a direction identical to the alignment direction of the magnetization $M_{10a}$ of the first surface 10a of the magnetization control layer 10.

The magnetization direction of the magnetization $M_{add}$ imparted to the magnetization control layer 10 and the magnetization direction of the magnetization $M_{20}$ of the magnetic coupling layer 20 are opposite to each other. That is, Zeeman energy generated by the magnetization $M_{add}$ imparted to the magnetization control layer 10 cancels energy provided from the magnetization $M_{20}$ of the magnetic coupling layer 20 via exchange coupling.

As described above, the magnetization control element 102 according to the second embodiment can reduce the influence of the magnetic field generated by the magnetization $M_{20}$ of the magnetic coupling layer 20 upon the magnetization control layer 10 and thus can reduce the difference between the energy required to transition from the F+ domain to the F− domain and the energy required to transition from the F− domain to the F+ domain. That is, the amounts of energy required to switch the magnetization control element 102 in both directions are made symmetrical and the switching operation of the magnetization control element 102 is stabilized.

Third Embodiment

Figure 9:
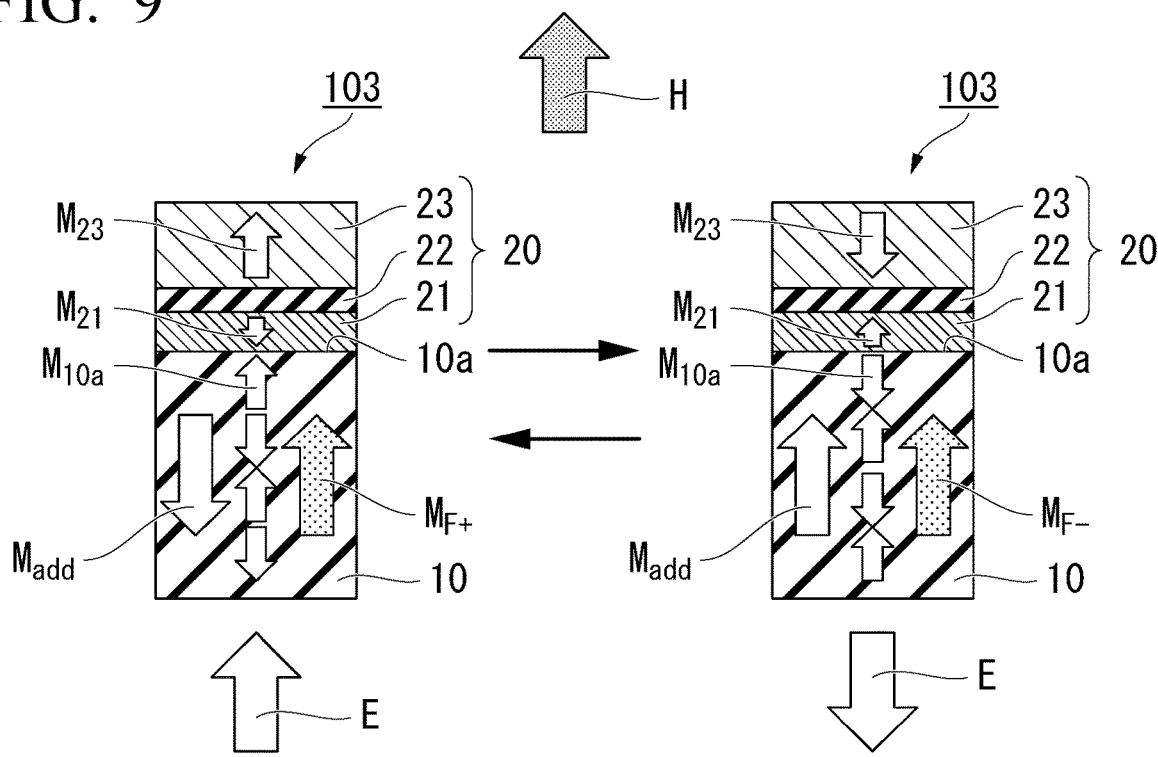
FIG. 9 is a diagram schematically showing the operation of a magnetization control element according to a third embodiment.

FIG. 9 is a diagram schematically showing the operation of a magnetization control element 103 according to a third embodiment.

In FIG. 9, the same components as those of the magnetization control element 100 according to the first embodiment are denoted by the same reference signs.

The magnetization control element 103 according to the third embodiment differs from the magnetization control element 100 according to the first embodiment in that a magnetic coupling layer 20 has a three-layer structure including a first ferromagnetic layer 21, an intermediate layer 22 and a second ferromagnetic layer 23. The exchange coupling between a magnetization control layer 10 and the magnetic coupling layer 20 is antiferromagnetic coupling and the direction of a magnetization $M_{add}$ imparted to the magnetization control layer 10 is opposite to the magnetization direction of a first surface (outermost surface) 10a of the control layer 10 on a side of the magnetic coupling layer 20.

The direction of the magnetization $M_{add}$ imparted to the magnetization control layer 10 is opposite to the direction of a magnetization $M_{F+}$ that develops in the magnetization control layer 10 due to the magnetoelectric effect when an electric field is applied in the +z direction. For example, this corresponds to the case where $Cr_2O_3$ is doped with $Ir^{3+}$.

Further, as shown in FIG. 9, in the magnetization control element 103, the exchange coupling between the magnetization control layer 10 and the first ferromagnetic layer 21 is antiferromagnetic coupling. Therefore, a magnetization $M_{21}$ of the first ferromagnetic layer 21 is aligned in the opposite direction to the alignment direction of the magnetization $M_{10a}$ of the first surface 10a of the magnetization control layer 10.

The magnetic coupling layer 20 has a synthetic structure including the first ferromagnetic layer 21, the intermediate layer 22 and the second ferromagnetic layer 23. The direction of the magnetization $M_{21}$ of the first ferromagnetic layer 21 and the direction of a magnetization $M_{23}$ of the second ferromagnetic layer 23 are made opposite to each other via the intermediate layer 22. The magnitude of the magnetization of the second ferromagnetic layer 23 is greater than the magnitude of the magnetization of the first ferromagnetic layer 21. Therefore, the direction of the magnetization of the overall magnetic coupling layer 20 is identical to the direction of the magnetization of the second ferromagnetic layer 23.

The direction of the magnetization $M_{add}$ imparted to the magnetization control layer 10 and the direction of the magnetization of the overall magnetic coupling layer 20 are opposite to each other. That is, Zeeman energy generated by the magnetization $M_{add}$ imparted to the magnetization control layer 10 cancels energy provided from the magnetization $M_{20}$ of the magnetic coupling layer 20 via exchange coupling.

As described above, the magnetization control element 103 according to the third embodiment can reduce the influence of a magnetic field generated by the overall magnetic coupling layer 20 upon the magnetization control layer 10 and thus can reduce the difference between the energy required to transition from the F+ domain to the F− domain and the energy required to transition from the F− domain to the F+ domain. That is, the amounts of energy required to switch the magnetization control element 103 in both directions are made symmetrical and the switching operation of the magnetization control element 103 is stabilized.

Fourth Embodiment

Figure 10:
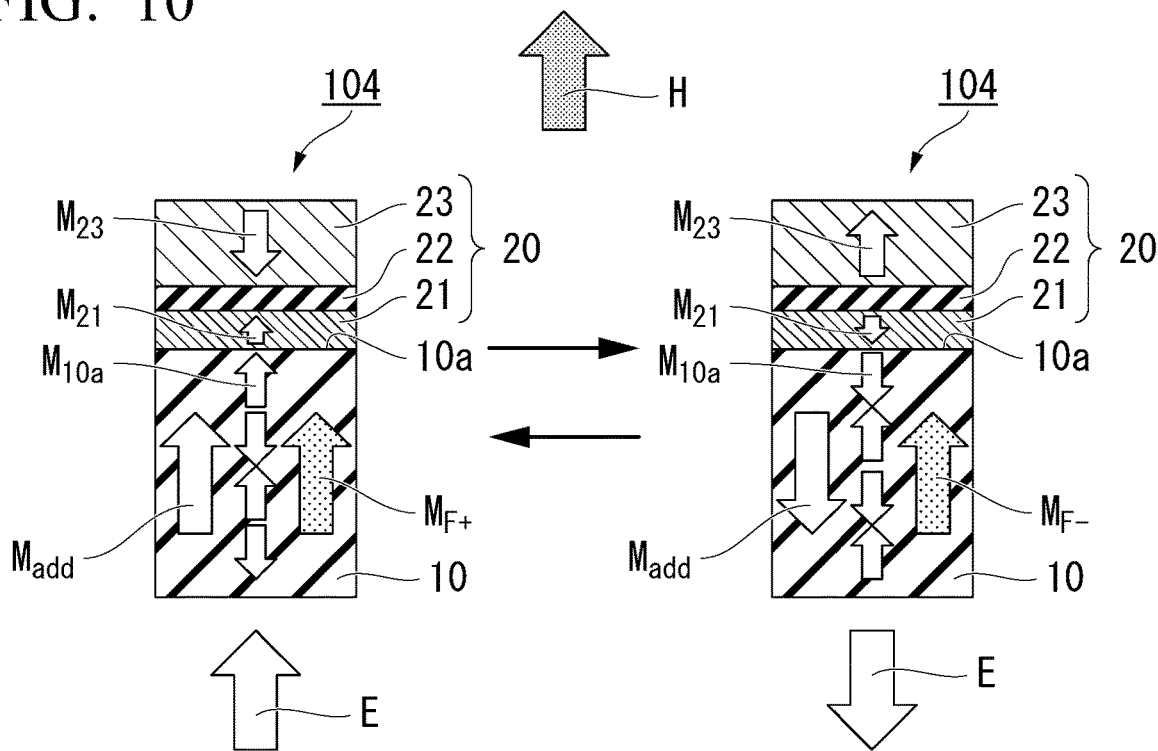
FIG. 10 is a diagram schematically showing the operation of a magnetization control element according to a fourth embodiment.

FIG. 10 is a diagram schematically showing the operation of a magnetization control element 104 according to a fourth embodiment.

In FIG. 10, the same components as those of the magnetization control element 103 according to the third embodiment are denoted by the same reference signs.

In the magnetization control element 104 according to the fourth embodiment, the exchange coupling between a magnetization control layer 10 and a first ferromagnetic layer 21 is ferromagnetic coupling and the direction of a magnetization $M_{add}$ imparted to the magnetization control layer 10 is identical to as the magnetization direction of a first surface (outermost surface) 10a of the control layer 10 on the magnetic coupling layer 20 side. The other components are the same as those of the magnetization control element 103 according to the third embodiment.

The direction of the magnetization $M_{add}$ imparted to the magnetization control layer 10 in the magnetization control element 104 according to the fourth embodiment is identical to the direction of a magnetization $M_{F+}$ that develops in the magnetization control layer 10 due to the magnetoelectric effect when an electric field is applied in the +z direction. For example, this corresponds to the case where $Cr_2O_3$ is doped with $Al^{3+}$ or $Ti^{4+}$.

Further, as shown in FIG. 10, in the magnetization control element 104, the exchange coupling between the magnetization control layer 10 and the first ferromagnetic layer 21 is ferromagnetic coupling. Therefore, the magnetization $M_{21}$ of the first ferromagnetic layer 21 is aligned in the same direction as the alignment direction of the magnetization Mica of the first surface 10a of the magnetization control layer 10.

The magnetic coupling layer 20 has a synthetic structure including the first ferromagnetic layer 21, the intermediate layer 22 and the second ferromagnetic layer 23. The direction of the magnetization $M_{21}$ of the first ferromagnetic layer 21 and the direction of the magnetization $M_{23}$ of the second ferromagnetic layer 23 are made opposite to each other via the intermediate layer 22. The magnitude of the magnetization of the second ferromagnetic layer 23 is greater than the magnitude of the magnetization of the first ferromagnetic layer 21. Therefore, the direction of the magnetization of the overall magnetic coupling layer 20 is identical to the direction of the magnetization of the second ferromagnetic layer 23.

The direction of the magnetization $M_{add}$ imparted to the magnetization control layer 10 and the direction of the magnetization of the overall magnetic coupling layer 20 are opposite to each other. That is, Zeeman energy generated by the magnetization $M_{add}$ imparted to the magnetization control layer 10 cancels energy provided from the magnetization $M_{20}$ of the magnetic coupling layer 20 via exchange coupling.

As described above, the magnetization control element 104 according to the fourth embodiment can reduce the influence of a magnetic field generated by the overall magnetic coupling layer 20 upon the magnetization control layer 10 and thus can reduce the difference between the energy required to transition from the F+ domain to the F− domain and the energy required to transition from the F− domain to the F+ domain. That is, the amounts of energy required to switch the magnetization control element 104 in both directions are made symmetrical and the switching operation of the magnetization control element 104 is stabilized.

(Magnetic Memory)

Figure 11:
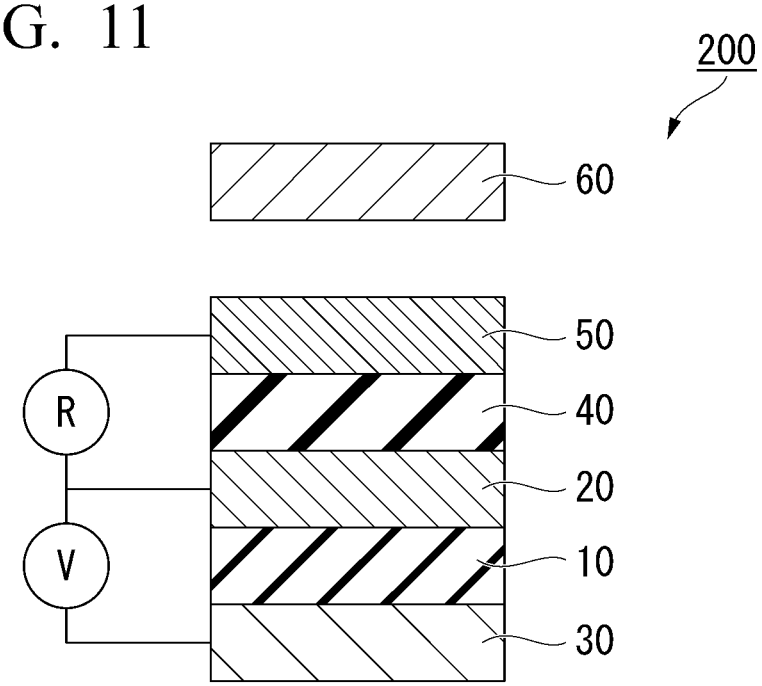
FIG. 11 is a schematic cross-sectional view of a magnetic memory according to the present embodiment.

FIG. 11 is a schematic cross-sectional view of a magnetic memory according to the present embodiment. The magnetic memory 200 shown in FIG. 11 includes the magnetization control element described above, a nonmagnetic layer 40, and a magnetization fixed layer 50.

The nonmagnetic layer 40 and the magnetization fixed layer 50 are provided, sequentially from the magnetic coupling layer 20 side, on the opposite side of a magnetic coupling layer 20 of the magnetization control element to a surface thereof provided with a magnetization control layer 10.

The magnetic memory 200 can apply an electric field to the magnetization control layer 10 by applying a voltage between the magnetic coupling layer 20 and an electrode 30 and can apply a magnetic field to the magnetization control layer 10 by a magnetic field applying part 60.

When an electric field and a magnetic field are applied to the magnetization control layer 10, the magnetization state of the magnetization control layer 10 changes. When the magnetization state of the magnetization control layer 10 changes, the alignment direction of the magnetization of the magnetic coupling layer 20 changes. The magnetic coupling layer 20 is provided with the magnetization fixed layer 50 via the nonmagnetic layer 40, and changes in resistance between these layers are monitored. A change in the alignment direction of the magnetization of the magnetic coupling layer 20 is output as a change in resistance.

That is, the magnetic memory according to the present embodiment can output a change in the magnetization state of the magnetization control layer 10 as a change in resistance.

Figure 12:
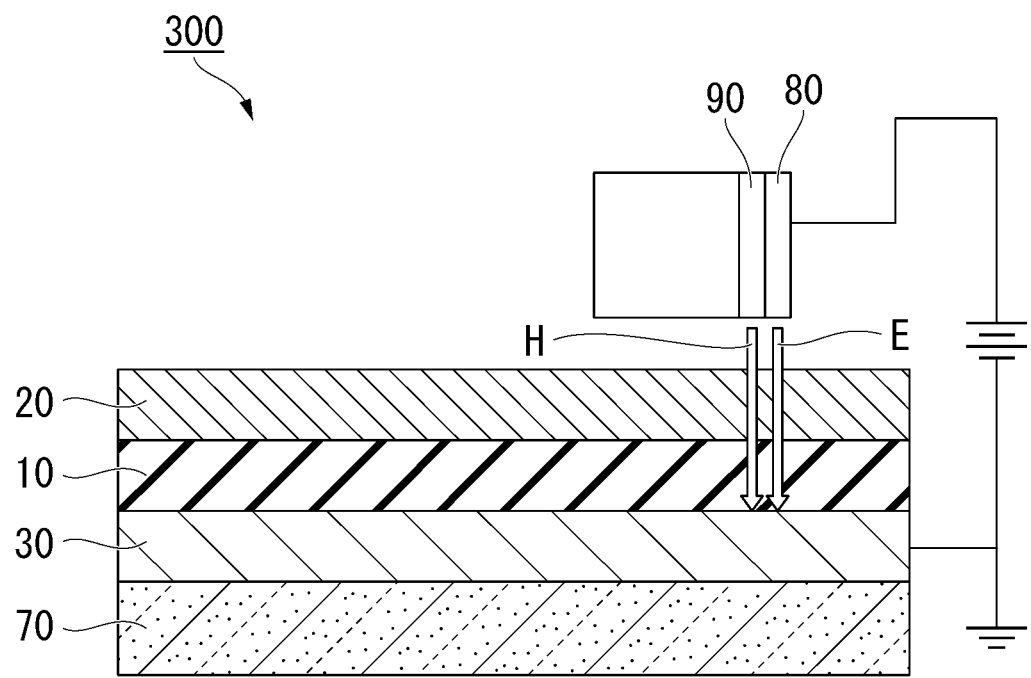
FIG. 12 is a schematic cross-sectional view of a magnetic recording system according to the present embodiment.

(Magnetic Recording System) FIG. 12 is a schematic cross-sectional view of a magnetic recording system according to the present embodiment. The magnetic recording system 300 shown in FIG. 12 includes the magnetization control element described above. The magnetic recording system 300 includes a magnetic head and a recording medium. The magnetic head includes an electric field applying part 80 and a magnetic field applying part 90. On the other hand, the recording medium includes a substrate 70, an electrode 30, a magnetization control layer 10, and a magnetic coupling layer 20.

When an electric field E and a magnetic field H are applied to the recording medium by the electric field applying part 80 and the magnetic field applying part 90, the magnetization state of the magnetization control layer 10 changes and the magnetization of the magnetic coupling layer 20 is aligned according to the magnetization state. That is, the direction of the magnetization of the magnetic coupling layer 20 can be controlled (data can be written) by the directions of the electric field E and the magnetic field H applied to the recording medium. Since the direction of magnetization is not rewritten unless an external force is applied, data is stored in a nonvolatile manner.

That is, the magnetic recording system according to the present embodiment can write data according to the directions of the electric field E and the magnetic field H applied from the magnetic head. To read data, for example, a reading part including a magnetoresistive element is provided in a magnetic head, which can read data as a change in resistance of the magnetoresistive element.

Although embodiments of the present disclosure have been described in detail with reference to the drawings, components, combinations thereof or the like in each embodiment are merely examples and additions, omissions, substitutions, and other modifications of components are possible without departing from the gist of the present disclosure.

EXAMPLES

Example 1

In Example 1, insulating properties of a sample in which at least one element of $Cr_2O_3$ was substituted that can be used for a magnetization control layer and a magnetization direction imparted by the substitution to the magnetization control layer of the sample were evaluated.

Example 1-1

In Example 1-1, a sample in which some $Cr^{3+}$ ions in $Cr_2O_3$ were substituted by $Al^{3+}$ ions was prepared. The sample in which at least one element was substituted was prepared through film formation by reactive RF magnetron sputtering using an alloy target of Cr and Al having a predetermined composition ratio. Then, insulating properties of the sample according to Example 1-1 and a magnetization direction generated by the substitution were measured. The measurement results are summarized in Table 1.

The magnetization direction generated by the substitution was determined through the following procedure. First, electric field/magnetic field annealing was performed on the substituted $Cr_2O_3$ to form a state in which the domain direction was only F+. The electric field and magnetic field annealing is a process of forming the state of only an F+ domain or an F− domain by cooling the sample while applying an external magnetic field H and an external electric field E thereto after resetting the magnetization state of $Cr_2O_3$ by heating the sample once to the Neel temperature or higher. Here, which domain can be made in relation to the magnetic field H and the electric field E is as shown in FIG. 3. Thereafter, an electric field was applied to the sample to determine the direction and magnitude of the generated magnetization.

Then, by examining magnetic properties (the direction and magnitude of magnetization) of $Cr_2O_3$ in the absence of an electric field in the state of only an F+ domain, the relationship between the direction of a magnetization developed in the magnetization control layer due to the magnetoelectric effect and the direction of the added magnetization was determined.

Example 1-2

In Example 1-2, a sample in which some $Cr^{3+}$ ions in $Cr_2O_3$ were substituted by $Ti^{4+}$ ions was prepared. Then, insulating properties of the sample according to Example 1-2 and a magnetization direction generated by the substitution were measured. The substitution method and the measurement method were the same as in Example 1-1. The measurement results are summarized in Table 1.

Example 1-3

In Example 1-3, a sample in which some $Cr^{3+}$ ions in $Cr_2O_3$ were substituted by $Ti^{4+}$ ion and $Mg^{2+}$ was prepared. Here, the amounts of addition were adjusted such that the main additive was $Ti^{4+}$ and the double additive was $Mg^{2+}$. Then, insulating properties of the sample according to Example 1-3 and a magnetization direction generated by the substitution were measured. The substitution method and the measurement method were the same as in Example 1-1. The measurement results are summarized in Table 1.

Example 1-4

In Example 1-4, a sample in which some $Cr^{3+}$ ions of $Cr_2O_3$ were substituted by $Ir^{4+}$ ions was prepared. Then, insulating properties of the sample according to Example 1-4 and a magnetization direction generated by the substitution were measured. The substitution method and the measurement method were the same as in Example 1-1. The measurement results are summarized in Table 1.

Example 1-5

In Example 1-5, a sample in which some $Fe^{3+}$ ions of $BiFeO_3$ were substituted by $Al^{3+}$ ions was prepared. The sample in which at least one element was substituted was prepared through film formation by reactive RF magnetron sputtering using an oxide target of $BiFe_{1-x}Al_xO_3$ having a predetermined composition ratio. Then, insulating properties of the sample according to Example 1-5 and a magnetization direction generated by the substitution were measured. The substitution method and the measurement method were the same as in Example 1-1. The measurement results are summarized in Table 1.

TABLE 1

|  | Base material | Substitution element | Ion radius of substitution element | Insulating properties | Magnetization direction |
|---|---|---|---|---|---|
| Example 1-1 | $Cr_2O_3$ | $Al^{3+}$ | 0.535 | A | Parallel |
| Example 1-2 | $Cr_2O_3$ | $Ti^{4-}$ | 0.605 | B | Parallel |
| Example 1-3 | $Cr_2O_3$ | $Ti^{4-}$ $Mg^{2+}$ | 0.605 0.720 | A | Parallel |
| Example 1-4 | $Cr_2O_3$ | $Ir^{4+}$ | 0.625 | C | Antiparallel |
| Example 1-5 | $BiFeO_3$ | $Al^{3+}$ | 0.535 | C | Parallel |

In Table 1, the degrees of insulation are such that A>B>C. The "magnetization direction" means the direction of a magnetization generated by the substitution with respect to the direction of the magnetization developed in the magnetization control layer due to the magnetoelectric effect.

As shown in Table 1, in the case of substitution by an element with an ion radius smaller than the ion radius of $Cr^{3+}$ (ion radius: 0.615 nm), the direction of a magnetization generated by the substitution was parallel to the direction of a magnetization developed in the magnetization control layer due to the magnetoelectric effect. Here, it is confirmed that the lattice of $Cr_2O_3$ substituted has a smaller a-axis and c-axis than the lattice of $Cr_2O_3$ not substituted and thus the lattice of $Cr_2O_3$ substituted has a smaller lattice volume than the lattice of $Cr_2O_3$ not substituted. On the other hand, in the case of substitution by an element with an ion radius greater than the ion radius of $Cr^{3+}$, the direction of a magnetization generated by the substitution was antiparallel to the direction of a magnetization developed in the magnetization control layer due to the magnetoelectric effect. Here, it is confirmed that the lattice of $Cr_2O_3$ substituted has a particularly greater c-axis than the lattice of $Cr_2O_3$ not substituted and thus the lattice of $Cr_2O_3$ substituted has a greater lattice volume than the lattice of $Cr_2O_3$ not substituted.

In the case of substitution by an element having a valence different from a valance of $Cr^{3+}$, the insulation tended to be lowered. Example 1-3, although substituted by an element having a different valence from $Cr^{3+}$, exhibited high insulation because the valence was compensated by $Ti^{4+}$ and $Mg^{2+}$. Here, the ion radius of $Mg^{2+}$ is greater than $Cr^{3+}$ such that their sizes cancel each other. However, since the lattice volume of $Cr_2O_3$ thus obtained is small, it is considered that the effect of the same direction as in the case of substitution by an element with a small ion radius is achieved as a whole. In the case of substitution by $Al^{3+}$ shown in Example 1-1, the magnetic anisotropy of the magnetization control layer was improved.

Also in the case of $BiFeO_3$ which is a different material from $Cr_2O_3$, it was confirmed that, when it was substituted by $Al^{3+}$ which is an element having an ion radius smaller than the ion radius of $Fe^{3+}$ (ion radius: 0.55 nm) as shown in Table 1, the direction of a magnetization generated by the substitution was parallel to the direction of a magnetization developed in the magnetization control layer due to the magnetoelectric effect. It was also confirmed that the insulation of $BiFeO_3$, when an element was added thereto, tended to be lowered compared to $Cr_2O_3$ since $BiFeO_3$ could easily take both trivalent (3+) and bivalent (2+) valence of Fe.

Example 2

In Example 2, a magnetization control element using $Cr_2O_3$ substituted by $Al^{3+}$ shown in Example 1-1 was prepared and its magnetic behavior was measured.

First, Pt(111) having a thickness of 25 nm was prepared as an electrode on a c-plane sapphire substrate through a DC sputtering method. By performing film formation on top of this at a substrate temperature of 500° C. by using a Cr target or an alloy target of Cr and Al adjusted to a predetermined composition through a reactive RF magnetron sputtering method, a magnetization control layer including an α-$Cr_2O_3$ (001) thin film or an Al-substituted α-$Cr_2O_3$ (001) thin film with a thickness of 500 nm was prepared.

Then, on the obtained magnetization control layer, Co was layered as a magnetic coupling layer via a spacer layer made of Ru through a DC sputtering method. The spacer layer is a layer for adjusting the strength of the exchange interaction between the magnetization control layer and the magnetic coupling layer. Finally, Pt was layered as an upper electrode layer. Thereafter, Ru, Co, and the upper electrode layer were patterned in a cross shape for measurement.

Figure 13A:
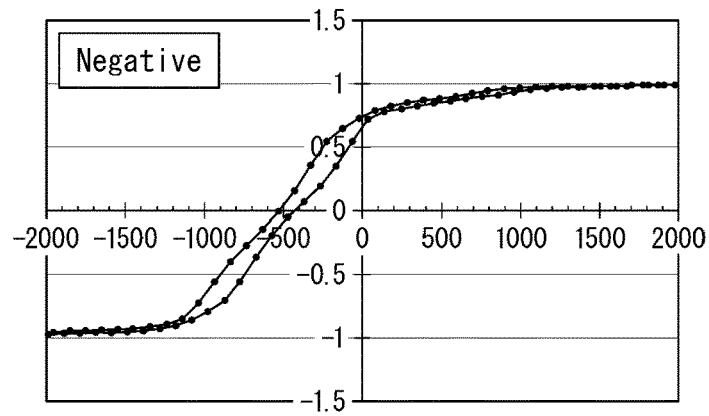
FIG. 13A shows the results of measurement of the magnetization state of the magnetic coupling layer by an anomalous Hall effect (AHE) when F+ domains and F− domains are present in $Cr_2O_3$ in a ratio of 0:100.
Figure 13B:
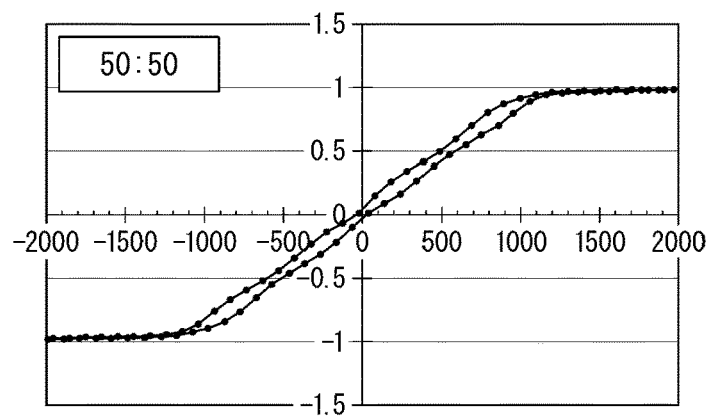
FIG. 13B shows the results of measurement of the magnetization state of the magnetic coupling layer by an anomalous Hall effect (AHE) when F+ domains and F− domains are present in $Cr_2O_3$ in a ratio of 50:50.
Figure 13C:
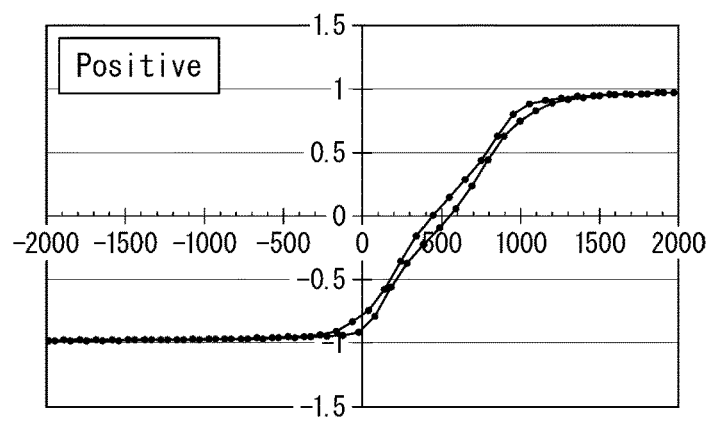
FIG. 13C shows the results of measurement of the magnetization state of the magnetic coupling layer by an anomalous Hall effect (AHE) when F+ domains and F− domains are present in $Cr_2O_3$ in a ratio of 100:0.

FIGS. 13A, 13B and 13C show the results of measurement of the magnetization state of the magnetization control layer by the anomalous Hall effect (AHE). In FIGS. 13A, 13B and 13C, measurement was performed at a temperature of 280K. FIG. 13B is a diagram showing a magnetization curve of the magnetic coupling layer when F+ and F− domains are present in $Cr_2O_3$ in a ratio of 50:50. FIG. 13A is a diagram showing a magnetization curve of the magnetic coupling layer when the ratio of the F− domain in $Cr_2O_3$ is 100% (hereinafter referred to as a "negative state"). FIG. 13C is a diagram showing a magnetization curve of the magnetic coupling layer when the ratio of the F+ domain in $Cr_2O_3$ is 100% (hereinafter referred to as a "positive state"). By thus measuring the magnetization curve of the magnetic coupling layer after a write operation, it is possible to evaluate how much the magnetization control layer has been reversed.

As shown in FIGS. 13A, 13B and 13C, the magnetization in a zero magnetic field upon reading can take a value that changes in sign depending on the domain state of the magnetization control layer. That is, by measuring the magnetization curve of the magnetic coupling layer after applying an external magnetic field H and an external electric field E, it is possible to evaluate whether or not the alignment direction of the magnetization has been switched.

Figure 14:
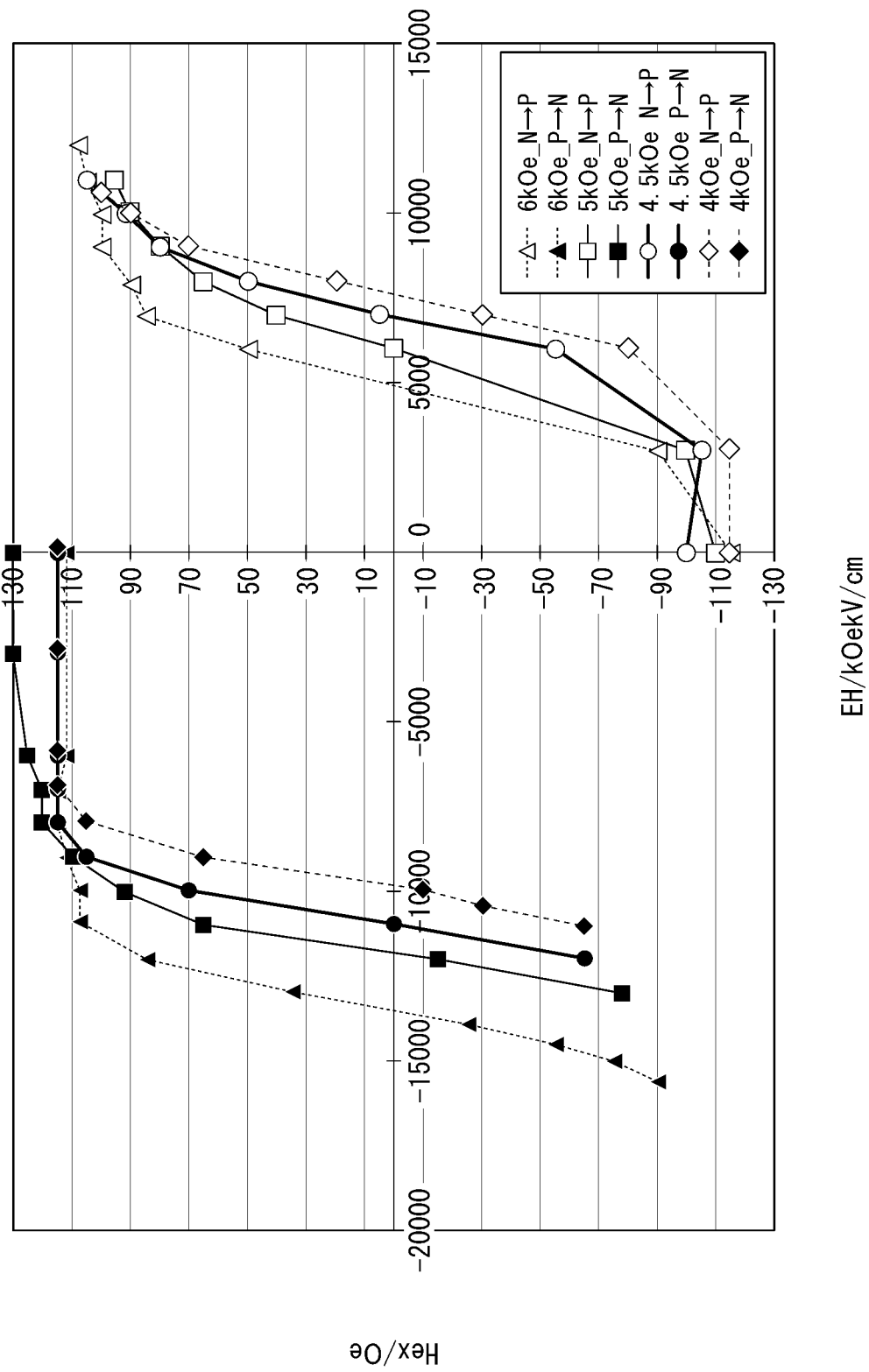
FIG. 14 is a diagram showing energy required for isothermal reversal as an applied external magnetic field changes.

FIG. 14 is a diagram showing energy required for magnetization switching as the applied external magnetic field changes. In FIG. 14, N P indicates behaviors when transitioning from the negative state (FIG. 13A) to the positive state (FIG. 13C) and P→N indicates behaviors when transitioning from the positive state (FIG. 13C) to the negative state (FIG. 13A).

As shown in FIG. 14, the energy required for N→P and the energy required for P→N become equal as the magnitude of the external magnetic field changes. Table 2 shows the energy required for N→P (EHhalf (N→P)), the energy required for P→N (EHhalf (P N)), and the like as the applied magnetic field changes. In the table below, the absolute difference indicates the absolute difference between the energy required for N→P (EHhalf (N→P)) and the energy required for P→N (EHhalf (P→N)), and reversal EH indicates the energy required to reverse the magnetization control layer.

TABLE 2

| Applied magnetic field | EHhalf (N→P) | EHhalf (P→N) | Absolute difference | Reversal EH |
|---|---|---|---|---|
| 6 kOe | 5000 | −13500 | 8500 | 9250 |
| 5 kOe | 6000 | −11800 | 5800 | 8900 |
| 4.5 kOe | 6900 | −11000 | 4100 | 8950 |
| 4 kOe | 7600 | −10000 | 2400 | 8800 |

Energy W that serves as driving power for the magnetization reversal of the magnetization control layer under an isothermal environment has a relationship of $W=W_{ME}+W_{EX}+W_{AFM}$. Here, $W_{ME}$ is energy applied to the magnetization control layer due to the magnetoelectric effect. $W_{EX}$ is energy that the magnetization control layer receives from the magnetic coupling layer through exchange interaction. $W_{AFM}$ is Zeeman energy due to the magnetization imparted to the magnetization control layer. That is, $W_{EX}$ is $M_{FM}d_{FM}H_{ex}/d_{AFM}$, and $W_{AFM}$ is $M_{AFM}H$.

In Example 2, $M_{AFM}$ (the imparted magnetization $M_{add}$) was fixed. Therefore, the energy required for state change can be changed by changing the magnitude of the applied external magnetic field, and the absolute difference between the energy required for N→P (EHhalf (N→P)) and the energy required for P→N (EHhalf (P→N)) can be reduced. Further, the absolute difference can be reduced even if $M_{AFM}$ (the imparted magnetization $M_{add}$) has changed from the above relationship.

REFERENCE SIGNS LIST

10 Magnetization control layer
10a First surface
20 Magnetic coupling layer
21 First ferromagnetic layer
22 Intermediate layer
23 Second ferromagnetic layer
30 Electrode
40 Nonmagnetic layer
50 Magnetization fixed layer
60, 90 Magnetic field applying part
70 Substrate
80 Electric field applying part
100, 101, 102, 103, 104 Magnetization control element
200 Magnetic memory
300 Magnetic recording system

The invention claimed is:
1. A magnetization control element comprising:
a magnetization control layer containing a magnetoelectric material exhibiting a magnetoelectric effect; and
a magnetic coupling layer that is magnetically coupled to a magnetization of a first surface of the magnetization control layer through exchange coupling and exhibits a magnetic state according to the magnetization of the first surface,
wherein a magnetization having a component in a direction opposite to a direction of a magnetization of the magnetic coupling layer is imparted to the magnetization control layer, and the magnetization control layer has, as a whole, a magnetization in the imparted magnetization direction.

2. The magnetization control element according to claim 1, wherein the magnetization control layer includes: a ferrimagnet; or an antiferromagnet in which at least one constituent element is substituted.

3. The magnetization control element according to claim 1, wherein a magnitude of magnetic energy that the magnetization imparted to the magnetization control layer generates upon writing is smaller than a magnitude of anisotropy energy of the magnetization control layer.

4. The magnetization control element according to claim 1, wherein the exchange coupling between the magnetization control layer and the magnetic coupling layer is antiferromagnetic coupling, and
the magnetization direction imparted to the magnetization control layer is identical to a magnetization direction of an outermost surface of the magnetization control layer on a side of the magnetic coupling layer.

5. The magnetization control element according to claim 1, wherein the magnetic coupling layer includes a first ferromagnetic layer, an intermediate layer, and a second ferromagnetic layer sequentially from a magnetization control layer side,
a magnitude of a magnetization of the second ferromagnetic layer is greater than a magnitude of a magnetization of the first ferromagnetic layer,
exchange coupling between the magnetization control layer and the first ferromagnetic layer is ferromagnetic coupling, and
the magnetization direction imparted to the magnetization control layer is the same as a magnetization direction of an outermost surface of the magnetization control layer on a magnetic coupling layer side.

6. The magnetization control element according to claim 1, wherein the exchange coupling between the magnetization control layer and the magnetic coupling layer is ferromagnetic coupling, and
the magnetization direction imparted to the magnetization control layer is opposite to a magnetization direction of an outermost surface of the magnetization control layer on a side of the magnetic coupling layer.

7. The magnetization control element according to claim 1, wherein the magnetic coupling layer includes a first ferromagnetic layer, an intermediate layer, and a second ferromagnetic layer sequentially from a magnetization control layer side,
a magnitude of a magnetization of the second ferromagnetic layer is greater than a magnitude of the first ferromagnetic layer,
exchange coupling between the magnetization control layer and the first ferromagnetic layer is antiferromagnetic coupling, and
the magnetization direction imparted to the magnetization control layer is opposite to a magnetization direction of an outermost surface of the magnetization control layer on a side of the magnetic coupling layer.

8. The magnetization control element according to claim 1, wherein the magnetization control layer contains: a material in which $Cr_2O_3$ is doped with a transition metal ion with an ion radius smaller than an ion radius of $Cr^{3+}$; or a material in which $BiFeO_3$ is doped with a transition metal ion with an ion radius smaller than an ion radius of $Fe^{3+}$.

9. The magnetization control element according to claim 1, wherein the magnetization control layer contains: a material in which $Cr_2O_3$ is doped with a transition metal ion with an ion radius greater than an ion radius of Cr3+; or a material in which BiFeO3 is doped with a transition metal ion with an ion radius greater ion radius of Fe3+.

10. The magnetization control element according to claim 1, further comprising:
    a magnetic field applying part configured to apply a magnetic field to the magnetization control layer; and
    an electric field applying part configured to apply an electric field to the magnetization control layer.

11. The magnetization control element according to claim 10, wherein a relationship of 0.75<MFMdFMHex/MAFM-dAFMH<1.25 holds when an external magnetic field that the magnetic field applying part applies to the magnetization control layer is H, an exchange bias magnetic field received by the magnetic coupling layer is Hex, a thickness of the magnetic coupling layer is dFM, a magnitude of the magnetization of the magnetic coupling layer is MFM, a thickness of the magnetization control layer is dAFM, and a magnitude of the magnetization of the magnetization control layer is MAFM.

12. A magnetic memory comprising:
    the magnetization control element according to claim 1; and
    a nonmagnetic layer and a magnetization fixed layer sequentially provided from a surface of the magnetic coupling layer opposite to the magnetization control layer on the surface of the magnetic coupling layer opposite to the magnetization control layer.

13. A magnetic recording system comprising the magnetization control element according to claim 1.

14. The magnetization control element according to claim 2, wherein a magnitude of magnetic energy that the magnetization imparted to the magnetization control layer generates upon writing is smaller than a magnitude of anisotropy energy of the magnetization control layer.

15. The magnetization control element according to claim 2, wherein the exchange coupling between the magnetization control layer and the magnetic coupling layer is antiferromagnetic coupling, and
    the magnetization direction imparted to the magnetization control layer is identical to a magnetization direction of an outermost surface of the magnetization control layer on a side of the magnetic coupling layer.

16. The magnetization control element according to claim 2, wherein the magnetic coupling layer includes a first ferromagnetic layer, an intermediate layer, and a second ferromagnetic layer sequentially from a magnetization control layer side,
    a magnitude of a magnetization of the second ferromagnetic layer is greater than a magnitude of a magnetization of the first ferromagnetic layer,
    exchange coupling between the magnetization control layer and the first ferromagnetic layer is ferromagnetic coupling, and
    the magnetization direction imparted to the magnetization control layer is the same as a magnetization direction of an outermost surface of the magnetization control layer on a magnetic coupling layer side.

17. The magnetization control element according to claim 2, wherein the exchange coupling between the magnetization control layer and the magnetic coupling layer is ferromagnetic coupling, and
    the magnetization direction imparted to the magnetization control layer is opposite to a magnetization direction of an outermost surface of the magnetization control layer on a side of the magnetic coupling layer.

18. The magnetization control element according to claim 2, wherein the magnetic coupling layer includes a first ferromagnetic layer, an intermediate layer, and a second ferromagnetic layer sequentially from a magnetization control layer side,
    a magnitude of a magnetization of the second ferromagnetic layer is greater than a magnitude of the first ferromagnetic layer,
    exchange coupling between the magnetization control layer and the first ferromagnetic layer is antiferromagnetic coupling, and
    the magnetization direction imparted to the magnetization control layer is opposite to a magnetization direction of an outermost surface of the magnetization control layer on a side of the magnetic coupling layer.

19. A magnetic memory comprising:
    the magnetization control element according to claim 2; and
    a nonmagnetic layer and a magnetization fixed layer sequentially provided from a surface of the magnetic coupling layer opposite to the magnetization control layer on the surface of the magnetic coupling layer opposite to the magnetization control layer.

20. A magnetic recording system comprising the magnetization control element according to claim 2.

* * * * *